United States Patent [19]

Stahlhofen

[11] Patent Number: 4,581,321
[45] Date of Patent: Apr. 8, 1986

[54] PROCESS FOR PRODUCING NEGATIVE COPIES IN A MATERIAL BASED ON 1,2-QUINONE DIAZIDES WITH THERMAL CURING AGENT

[75] Inventor: Paul Stahlhofen, Wiesbaden, Fed. Rep. of Germany

[73] Assignee: Hoechst Aktiengesellschaft, Frankfurt am Main, Fed. Rep. of Germany

[21] Appl. No.: 626,760

[22] Filed: Jul. 2, 1984

[30] Foreign Application Priority Data

Jul. 11, 1983 [DE]  Fed. Rep. of Germany ....... 3325022

[51] Int. Cl.$^4$ .......................... G03F 7/00; G03F 7/08; G03F 7/26
[52] U.S. Cl. .................................... 430/325; 430/165; 430/166; 430/191; 430/192; 430/193; 430/302; 430/328; 430/330
[58] Field of Search ............... 430/325, 328, 330, 192, 430/191

[56] References Cited

U.S. PATENT DOCUMENTS

| | | | |
|---|---|---|---|
| 3,264,104 | 8/1966 | Reichel | 96/33 |
| 3,402,044 | 9/1968 | Steinhoff et al. | 430/192 |
| 3,660,097 | 5/1972 | Mainthia | 430/192 |
| 4,104,070 | 8/1978 | Moritz et al. | 96/36 |
| 4,125,650 | 11/1978 | Chiu et al. | 430/330 |
| 4,196,003 | 4/1980 | Watanabe | 430/193 |
| 4,259,430 | 3/1981 | Kaplan et al. | 430/192 |
| 4,387,152 | 6/1983 | Stahlhofen | 430/330 |

FOREIGN PATENT DOCUMENTS

0024916 11/1981 .
2082339 3/1982 United Kingdom .

OTHER PUBLICATIONS

DeForest, W. S., "Photoresist Materials and Processes", McGraw-Hill Book Co., 1975, pp. 47–49 and 55–59.
Pocansky, J., et al., *IBM J. Res. Dev.*, vol. 23, No. 1, 1/1979, pp. 42–51.
Hawley, G., *The Condensed Chemical Dictionary*, 10th ed., 1981, p. 649.

*Primary Examiner*—Charles L. Bowers, Jr.
*Attorney, Agent, or Firm*—Schwartz, Jeffery, Schwaab, Mack, Blumenthal & Evans

[57] ABSTRACT

A process for producing negative relief copies is disclosed in which a light-sensitive material, comprising (1) a light-sensitive ester or amide of a 1,2-quinone-diazide-sulfonic acid or of a 1,2-quinone-diazide-carboxylic acid and (2) a hexamethylol melamine ether is imagewise exposed, thereafter heated, and, after cooling, exposed again without an original, and subsequently developed by means of an aqueous-alkaline developer. The disclosed process permits the production of negative copies with the aid of a material which yields positive copies when it is processed in a conventional manner.

12 Claims, No Drawings

PROCESS FOR PRODUCING NEGATIVE COPIES IN A MATERIAL BASED ON 1,2-QUINONE DIAZIDES WITH THERMAL CURING AGENT

BACKGROUND OF THE INVENTION

The present invention relates to a reversal process for producing negative copies by means of a normally positive-working light-sensitive material based on 1,2-quinone diazides.

It is known that positive-working reproduction materials based on 1,2-naphthoquinone diazides can be negatively processed by a particular sequence of treatment steps. In U.S. Pat. No. 3,264,104, a reversal process of this kind is described in which the light-sensitive layer, which preferably contains thermoplastic polymers, is imagewise exposed, is treated with an alkaline solution or with water (if appropriate, at an elevated temperature) without washing off the exposed areas in the process, is then exposed again without an original, and finally is developed in a conventional manner, such that the originally imagewise exposed areas remain on the support and the other areas are washed off.

This process has the disadvantages that a comparatively large number of treatment steps are required; that the first treatment with alkali must invariably be carried out with particular care, in order to detach as little as possible of the exposed layer, which is soluble in aqueous alkali; and that it is necesary to add polymers which are sparingly soluble in alkali and which limit the applicability of the material to other uses.

European Patent Application No. 0,024,916 discloses a similar reversal process for the production of resist layers, in which a photosensitive material based on 1,2-quinone diazides is heated after imagewise exposure, then exposed again without an original and developed with an aqueous alkaline solution to form a negative. The light-sensitive layer of the disclosed material contains particular photochromic compounds which react with the products of the photoreaction undergone by the quinone diazide with heating of the material, and are stated to effect curing of the layer. In this material, photochromic substances must be present, the photoreaction of which produces a discoloration which is inconvenient in some applications.

British Pat. No. 2,082,339 describes a light-sensitive composition comprising an o-quinone diazide and at least one resol, for use in the manufacture of a lithographic printing plate which is suitable for both positive and negative processing. This reversal process covers the same sequence of steps as the process disclosed by the aforementioned European patent application. The reversal action is based on the fact that the photodecomposition products of the o-quinone diazide form an insoluble reaction product with the resol, under the action of heat. A reaction of this kind does not occur if novolaks are used. The printing plates so produced have the disadvantage of a relatively poor shelf-life, due to the self-curing character of resols.

In German Offenlegungsschriften Nos. 2,855,723 and 2,529,054, resist layers comprising 1,2-quinone diazides are described, which layers are used for a reversal process and contain, in addition, N-acyl-N'-methylolethylenediamines or hydroxyethylimidazoles to effect thermal curing of the layer. A similar material comprising secondary or tertiary amines is described in U.S. Pat. No. 4,196,003.

Additives of the kind mentioned above, however, generally have an adverse influence on the shelf-life of the copying layers and on specific properties relating to copying technique, such as, for example, sensitivity to light and image contrast after exposure. Moreover, for many applications the temperature which is necessary to obtain an image reversal is too high, or the period of heating required at a lower temperature is too long.

SUMMARY OF THE INVENTION

It is, therefore, an object of the present invention to provide a reversal process for producing negative copies by means of a normally positive-working light-sensitive material based on 1,2-quinone diazides, such that the incorporation of additives which impair the shelf-life of the copying layer is unnecessary, and that only a short heating time at relative low temperatures is required to effect thermal curing of the exposed layer areas.

In accomplishing the foregoing objects, there has been provided, in accordance with one aspect of the invention, a process for producing negative relief copies, comprising the steps of (1) imagewise exposing a light-sensitive material through an original, said material comprising a support and a light-sensitive layer which comprises a compound that promotes thermal curing, which compound comprises an ether of hexamethylol melamine, and at least one 1,2-quinone diazide; (2) thereafter heating the material; (3) then, after cooling, exposing the material again without the original; and (4) thereafter developing the means with an aqueous-alkaline developer.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF PREFERRED EMBODIMENTS

The process of the present invention is characterized in that the material contains, as the compound which promotes thermal curing, an ether of hexamethylol melamine.

Sensitizers which are suitable for use according to the present invention comprise 1,2-quinonediazide-sulfonic acid esters, 1,2-quinonediazide-sulfonic acid amides, 1,2-quinonediazide-carboxylic acid esters and 1,2-quinonediazide-carboxylic acid amides which are rendered soluble in aqueous-alkaline solutions after irradiation with actinic light. Included are the reaction products of the 4- and 5-sulfonic acid of 1,2-benzoquinone diazide, and the reaction products of the 4- and 5-sulfonic acid of 1,2-naphthoquinone diazide (or the acid chlorides thereof) with phenol-aldehyde/acetone condensation products or with polymers of p-hydroxystyrene, p-aminostyrene, or with copolymers of these last two compounds.

The amides and esters of the 4-sulfonic acids and the 4-carboxylic acids of 1,2-quinone diazide are particularly advantageously used, since, in processing according to the present invention, they yield a reversal effect even without an addition of hexamethylol melamine ethers. When these compounds are used, therefore, it is possible either to lower the amount of hexamethylol melamine ether or to reduce the time or the temperature of heating.

Esters of the 1,2-quinone diazide derivatives which can be used include the known reaction products of the acids, or of the halides thereof, with phenols, in particular with polyhydric phenols, such as 2,3,4-trihydroxy-benzophenone, 2,4-dihydroxy-benzophenone, 4-decanoyl-resorcinol, 4-(2-phenyl-prop-2-yl)-phenol, gallic acid octylester, or 4,4-bis-(4-hydroxyphenyl)-valeric acid butylester. The amides may be derived in a known manner from longer-chain aliphatic amines or, preferably, from aromatic amines.

The amount of o-quinonediazide compounds used in accordance with the present invention generally ranges from 3 to 50% by weight, preferably from 7 to 35% by weight, based on the weight of the non-volatile constituents of the copying layer.

In general, the alkyl ether groups of the hexamethylol melamine ethers used in accordance with the present invention have from 1 to 10, preferably from 1 to 4, carbon atoms. Methyl ethers are preferred. The hexamethylol melamine can be completely or partially etherified. Partially etherified products which may be used include, in particular, technical-grade mixtures of components having different degrees of etherification. The hexaalkyl ethers are usually preferred over the partially etherified compounds. The concentration of the hexamethylol melamine ethers in the light-sensitive composition can be varied within relatively wide limits. In general, they are present in amounts from 1 to 50% by weight, preferably from 3 to 45% by weight, based on the weight of the nonvolatile constituents of the light-sensitive composition. If the composition comprises a polymeric binder, the quantitative proportion of hexamethylol melamine preferably does not exceed 30% by weight.

At normal ambient temperatures, the reactivity of the crosslinking groups —$CH_2$—O—R of the hexamethylol melamine ethers is obviously not high enough to produce premature crosslinking in the layer, so that copying layers which are stored at room temperature in the unexposed state have a long shelf-life.

Preferably, the light-sensitive compositions further contain a polymeric, water-insoluble resinous binder which is soluble in the solvents used for the composition according to the present invention and is also soluble, or at least swellable, in aqueous alkaline solutions.

The novolak condensation resins, widely used in many positive copying materials based on naphthoquinone diazides, have also proved useful as binders in the process according to the present invention. These novolaks can also be modified, in a known manner, by reacting some of their hydroxy groups, for example, with chloroacetic acid, isocyanates, epoxides or carboxylic acid anhydrides. Additional preferred binders which are soluble or swellable in alkali include polyhydroxyphenyl resins which are prepared by condensing phenols with aldehydes or ketones; copolymers of styrene and maleic anhydride; polyvinylphenols; and copolymers of acrylic acid or methacrylic acid, in particular with acrylic or methacrylic acid esters. The type and quantity of the alkali-soluble resin may vary depending on the intended purpose; preferably, the proportion of alkali-soluble resins in the total solids is between 90 and 30% by weight, particularly preferably between 85 and 55% by weight.

Moreover, numerous other resins can also be used. Preferably, these include epoxy resins and vinyl polymers, such as polyvinyl acetates, polyacrylates, polyvinyl acetals, polyvinyl ethers, polyvinylpyrrolidones and copolymers of the monomers on which these are based, as well as hydrogenated or partially hydrogenated colophony derivatives. The most advantageous proportion of these resins depends on technical requirements and the effect on the development conditions, and is, in general, not more than 50% by weight, preferably from about 2 to 35% by weight, of the alkali-soluble resin. To meet special requirements, such as flexibility, adhesion, gloss and coloration, the light-sensitive composition can additionally contain substances such as polyglycols; cellulose derivatives, such as ethylcellulose; surfactants, dyes, adhesion-promoters and finely-divided pigments; and also ultraviolet absorbers, if required.

For color change after exposure, the light-sensitive composition can also be admixed with small amounts of radiation-sensitive components which preferably form or split-off strong acids upon exposure and produce a color change in a subsequent reaction with a suitable dye. Radiation-sensitive components of that kind include, for example, 1,2-naphthoquinone-diazide-4-sulfonic acid chloride, halogenomethyl-s-triazines which have chromophoric substituents, and diazonium compounds in the form of their salts with complex acids, such as tetrafluoroboric acid or hexafluorophosphoric acid.

For coating a suitable support, the compositions are in general dissolved in a solvent. The selection of the solvents should be matched to the coating process to be used, the desired layer thickness, and the drying conditions. Suitable solvents for the composition according to the present invention are ketones, such as methyl ethyl ketone; chlorinated hydrocarbons, such as trichloroethylene and 1,1,1-trichloroethane; alcohols, such as n-propanol, ethers such as tetrahydrofuran; alcoholethers, such as ethylene glycol monoethyl ether; and esters, such as butyl acetate. It is also possible to use mixtures which, for special purposes, can also contain solvents, such as acetonitrile, dioxane or dimethylformamide. In principle, all those solvents which do not irreversibly react with the layer components can be used. Particularly preferred solvents comprise the partial ethers of glycols, especially ethylene glycol monomethyl ether.

In most cases, the supports used for layer thicknesses of less than about 10 μm are metals. The following may be used for offset printing plates: mill-finished, mechanically or electrochemically roughened aluminum which, if desired, has been anodically oxidized and which additionally can also have been chemically pretreated, for example, with polyvinylphosphonic acid, silicates, phosphates, hexafluorozirconates, or with hydrolyzed tetraethyl orthosilicate.

Coating of the support material is carried out in a known manner by spin-coating, by spraying, by dipping, by roller-coating, by means of slot dies, by bladespreading or by means of a coater application. Light sources customary in industry are used for exposure. Irradiation with electrons or a laser is another possibility for producing an image.

The aqueous-alkaline solutions which are used for developing have a graduated alkalinity, that is to say, they have a pH which is preferably in the range between 10 and 14, and they can also contain minor amounts of organic solvents or surfactants.

After imagewise irradiation or exposure, the material is heated without any further intermediate treatment. Heating can be effected by irradiation, convection, contact with heated surfaces, for example, with rollers, or by immersion in a heated bath comprising an inert liquid, for example, water. The temperature can range between 70° and 150° C., preferably between 90° and 130° C. These temperatures are tolerated by the compositions of the present invention without any significant change in the properties of the unexposed areas. The duration of heating can vary widely, depending on the method chosen for the application of heat. If a heat-transferring medium is used, the heating time generally ranges between 10 seconds and 10 minutes, preferably between 30 seconds and 4 minutes.

Following heating and cooling, the light-sensitive layer is subjected to an overall exposure, whereby the layer areas which are still sensitive to light are completely converted into their photodecomposition products. For the second exposure, the light source employed in the imagewise exposure can advantageously be used again.

The second exposure is followed by developing with conventional developers, whereby the layer areas which were not struck by light in the original imagewise exposure are washed off. Suitable developers preferably comprise aqueous solutions of alkaline substances, for example, of alkali-metal phosphates, silicates, carbonates or hydroxides, which can additionally contain surfactants or relatively small amounts of organic solvents. In particular cases, suitable developers also comprise organic solvents or mixtures of organic solvents with water. The material can be developed either immediately after heating and cooling, or after a time interval of, for example, several hours, without any attack occurring in the hardened layer areas. This indicates that the exposed layer areas are irreversibly cured by heating.

Compared with conventional reversal processes, the process of the present invention has the advantage that, notwithstanding a good shelf-life of the copying layers, curing of the imagewise exposed layer areas at an elevated temperature takes place relatively quickly, and that the temperature of baking which is required for the reversal step is lower, and the dwell time at elevated temperature considerably shorter, than in known processes. In addition, the process makes possible the control of resolution by varying the exposure times.

Neither additional treatment steps in which liquids are used nor any particular composition for the light-sensitive material is required. For the only additional treatment step, i.e., heating, existing drying apparatus can easily be used in most cases. The second exposure without an original is most simply performed with the aid of the light source used for exposing the material imagewise.

The process of the present invention can, for example, be applied in the production of printing forms for letter-press printing, gravure printing and planographic printing; in the production of photoresist stencils for the subtractive and additive preparation of printed circuit boards; in the production of nickel screen-printing cylinders prepared by an electroplating process; and in the production of masks in microelectronics, according to the lift-off technique.

In the examples which follow, preferred embodiments of the process according to the present invention are described. Percentages and quantitative ratios are to be understood as units of weight, unless otherwise indicated.

EXAMPLE 1

An electrolytically roughened and anodically oxidized aluminum sheet was coated with a solution comprising:

3.00 parts by weight of the esterification product obtained from 1 mole of 4-(2-phenylprop-2-yl)phenol and 1 mole of naphthoquinone-(1,2)-diazide-(2)-4-sulfonic acid chloride, 0.20 part by weight of naphthoquinone-(1,2)-diazide-(2)-4-sulfonic acid chloride, 6.00 parts by weight of a cresol-formaldehyde novolak having a softening range from 105° to 120° C. as measured according to the capillary method DIN 53,181, 2.00 parts by weight of hexamethylol melamine hexamethyl ether, and 0.06 part by weight of crystal violet, in 50.00 parts by weight of ethylene glycol monomethyl ether and 50.00 parts by weight of tetrahydrofuran.

The anodically oxidized aluminum support had been treated with an aqueous solution of polyvinylphosphonic acid, as described in German Pat. No. 1,621,478, before the light-sensitive copying layer was applied.

The presensitized material prepared in this manner, in which the light-sensitive copying layer had a layer weight of about 2.9 g/m$^2$, was imagewise exposed under a transparent positive original and then developed with a 2% strength aqueous solution of sodium metasilicate.9H$_2$O. In the developing procedure, the portions of the copying layer which had been struck by light were removed and the unexposed image areas remained on the support, such that a printing stencil corresponding to the original was obtained. Inking with a greasy printing ink yielded a positive printing form which was ready for printing.

Another sample of the same presensitized material was processed to give a negative printing plate. For this purpose, the sample was exposed under a negative original, thereafter heated for 30 seconds at 90° C. or for 2 minutes at 80° C., and then exposed again without an original for the same period of time as used in the imagewise exposure. Upon developing in the same developer and for the same period of time as used above, a reversed image of the original was obtained.

Both the positive printing form and the negative printing form were capable of being baked at temperatures above 180° C., as a result of which the number of printed copies obtained could be increased many times over.

EXAMPLE 2

An electrochemically roughened and anodically oxidized aluminum sheet which had been treated with an aqueous solution of 0.1% by weight of polyvinylphosphonic acid was coated with a solution comprising 4.00 parts by weight of the esterification product obtained from 1 mole of 2,3,4-trihydroxy-benzophenone and 3 moles of naphthoquinone-1,2-diazide-(2)-5-sulfonic acid chloride, 3.00 parts by weight of hexamethylol melamine hexamethyl ether, 0.30 parts by weight of naphthoquinone-(1,2)-diazide-(2)-4-sulfonic acid chloride, and 0.06 part by weight of crystal violet, in 25.00 parts by weight of ethylene glycol monomethyl ether and 25.00 parts by weight of tetrahydrofuran.

The presensitized material prepared in this manner, in which the light-sensitive copying layer had a layer weight of 3 g/m$^2$, was imagewise exposed under a transparent positive original and then was developed with a 0.5% strength solution of sodium metasilicate to produce a positive printing stencil corresponding to the original.

Another sample of the same material was processed to give a negative printing plate. For this purpose, the sample was exposed under a negative original; was thereafter heated for 30 seconds at 120° C., for 1 minute at 100° C., for 3 minutes at 90° C., or for 4 minutes at 80° C., respectively; and then was exposed again without an original for the same period of time as used in the imagewise exposure. Upon developing in the same developer and for the same period of time as used above, a reversed image of the original was obtained.

EXAMPLE 3

An aluminum sheet which had been treated as indicated in Example 1 was coated with a solution comprising

- 3.00 parts by weight of the naphthoquinone diazide sulfonic acid ester specified in Example 2,
- 6.00 parts by weight of the cresol-formaldehyde novolak specified in Example 1,
- 3.00 parts by weight of hexamethylol melamine hexamethyl ether,
- 0.30 part by weight of 2-(4-ethoxy-naphth-1-yl)-4,6-bis-trichloromethyl-s-triazine, and
- 0.06 part by weight of crystal voilet, in
- 50.00 parts by weight of ethylene glycol monomethyl ether and
- 50.00 parts by weight of tetrahydrofuran.

The presensitized material prepared in this manner, in which the light-sensitive copying layer had a layer weight of 3 g/m$^2$, was imagewise exposed under a transparent positive original and then developed with a 4% strength solution of sodium metasilicate to produce a positive printing stencil corresponding to the original.

Another sample of the same material was processed to give a negative printing plate. For this purpose, the sample was exposed under a negative original; was thereafter heated for 30 seconds at 120° C., for 1 minute at 100° C., for 2 minutes at 90° C., or for 4 minutes at 80° C., respectively; and then was exposed again without an original for the same period of time as used in the imagewise exposure. Upon developing in the same developer and for the same period of time as used above, a reversed image of the original was obtained.

EXAMPLE 4

An aluminum sheet which had been pretreated as indicated in Example 1 was coated with a solution comprising:

- 4.00 parts by weight of the esterification product obtained from 1 mole of the ethoxyethyl ester of 4,4-bis-(4-hydroxyphenyl)-n-valeric acid and 2 moles of naphthoquinone-(1,2)-diazide-(2)-5-sulfonic acid chloride,
- 5.00 parts by weight of a poly-p-vinylphenol with a mean molecular weight of 10,000,
- 1.00 part by weight of hexamethylol melamine hexamethyl ether,
- 0.20 part by weight of naphthoquinone-(1,2)-diazide-(2)-4-sulfonic acid chloride, and
- 0.07 part by weight of crystal violet, in
- 50.00 parts by weight of ethylene glycol monomethyl ether and
- 50.00 parts by weight of tetrahydrofuran.

The presensitized material prepared in this manner, in which the light-sensitive copying layer had a layer weight of 2.8 g/m$^2$, was imagewise exposed under a transparent positive original and then developed with a 1% strength solution of sodium metasilicate, such that a positive stencil corresponding to the original was obtained.

Another sample of the same material was processed to give a negative printing plate. For this purpose, the sample was exposed under a negative original; was thereafter heated for 30 seconds at 140° C., for 2 minutes at 100° C., or for 3 minutes at 90° C., respectively; and then was exposed again without an original for the same period of time as used in the imagewise exposure. Upon developing in the same developer and for the same period of time as used above, a reversed image of the original was obtained.

EXAMPLE 5

An electrolytically roughened and anodically oxidized aluminum sheet was coated with a solution comprising:

- 3.00 parts by weight of the naphthoquinone diazide sulfonic acid ester specified in Example 1,
- 6.00 parts by weight of the cresol-formaldehyde novolak specified in Example 1,
- 0.60 parts by weight of hexamethylol melamine hexamethyl ether,
- 0.10 part by weight of 2-(4-ethoxy-naphth-1-yl)-4,6-bis-trichloromethyl-s-triazine, and
- 0.075 part by weight of crystal violet, in
- 50.00 parts by weight of ethylene glycol monomethyl ether and
- 50.00 parts by weight of tetrahydrofuran.

The presensitized material prepared in this manner, in which the light-sensitive copying layer had a layer weight of 2.5 g/m$^2$, was imagewise exposed under a transparent positive original and then developed with a 2% strength solution of sodium metasilicate, such that a positive printing stencil corresponding to the original was obtained.

Another sample of the same material was processed to give a negative printing plate. For this purpose, the sample was exposed under a negative original, thereafter was heated for 30 seconds at 120° C. or for 1 minute at 100° C., respectively, and then was exposed again without an original for the same period of time as used in the imagewise exposure. Upon developing in the same developer and for the same period of time as used above, a reversed image of the original was obtained.

What is claimed is:

1. A process for producing negative relief copies, comprising the steps of:
    (a) imagewise exposing to light, through an original, a light-sensitive material comprising a support and a light-sensitive layer which comprises in admixture
        (i) a compound comprising an alkyl ether of hexamethylol melamine wherein said alkyl ether is an alkyl ether group of 1 to 10 carbon atoms, said compound being present in an amount sufficient to promote thermal curing, and (ii) at least one 1,2-quinone diazide present in an amount sufficient to impart light-sensitivity to said layer;

(b) thereafter heating said material such that imagewise exposed portions of said material are rendered insoluble in alkaline developer;

(c) then after cooling, exposing said material again to light without said original; and thereafter (d) developing said material with an aqueous-alkaline developer to remove from said substrate portions of said layer not imagewise exposed in step (a).

2. A process as claimed in claim 1, wherein said ether comprises a methyl ether.

3. A process as claimed in claim 2, wherein said methyl ether comprises hexamethylol melamine hexamethyl ether.

4. A process as claimed in claim 1, wherein step (b) comprises heating said material to a temperature in the range from about 70° to about 150° C.

5. A process as claimed in claim 1, wherein step (b) comprises heating said material for a period of time ranging from about 10 seconds to about 10 minutes.

6. A process as claimed in claim 1, wherein said light-sensitive layer further comprises a binder which is insoluble in water and soluble in aqueous-alkaline solutions.

7. A process as claimed in claim 6, wherein said binder comprises a novolak.

8. A process as claimed in claim 6, wherein said binder comprises at least one alkali-soluble resin.

9. A process as claimed in claim 8, wherein said binder contains between about 30 and about 90% of alkali-soluble resin, based on total solids in said binder.

10. A process as claimed in claim 1, wherein said light-sensitive layer comprises from 3 to 50% by weight of 1,2-quinone diazide based on nonvolatile constituents of said light-sensitive layer.

11. A process as claimed in claim 1, wherein said light-sensitive layer comprises from 1 to 50% by weight of hexamethylol melamine ether, based on nonvolatile constituents of said light-sensitive layer.

12. A process as claimed in claim 1, wherein said light-sensitive layer comprises an ester or an amide of a 1,2-quinone-diazide-4-sulfonic acid or of a 1,2-quinone-diazide-4-carboxylic acid.

* * * * *